(12) United States Patent
Tsutsui (10) Patent No.: US 11,523,497 B2
(45) Date of Patent: Dec. 6, 2022

(54) ELECTRIC POWER CONVERSION APPARATUS AND ELECTRIC POWER STEERING APPARATUS USING THE SAME

(71) Applicant: DENSO CORPORATION, Kariya (JP)

(72) Inventor: Toshio Tsutsui, Kariya (JP)

(73) Assignee: DENSO CORPORATION, Kariya (JP)

( * ) Notice: Subject to any disclaimer, the term of this patent is extended or adjusted under 35 U.S.C. 154(b) by 1038 days.

(21) Appl. No.: 16/305,244

(22) PCT Filed: Mar. 28, 2017

(86) PCT No.: PCT/JP2017/012625
§ 371 (c)(1),
(2) Date: Nov. 28, 2018

(87) PCT Pub. No.: WO2017/208599
PCT Pub. Date: Dec. 7, 2017

(65) Prior Publication Data
US 2020/0187347 A1  Jun. 11, 2020

(30) Foreign Application Priority Data
Jun. 1, 2016 (JP) .............................. JP2016-109834

(51) Int. Cl.
*H05K 1/02* (2006.01)
*H02P 7/03* (2016.01)
(Continued)

(52) U.S. Cl.
CPC ......... *H05K 1/0209* (2013.01); *B62D 5/0463* (2013.01); *H02M 3/158* (2013.01);
(Continued)

(58) Field of Classification Search
CPC ........ B62D 5/04; B62D 5/046; B62D 5/0463; H05K 1/0201; H05K 1/0209; H02M 3/158; H02P 7/04; H02P 7/292; G05F 1/56
See application file for complete search history.

(56) References Cited

U.S. PATENT DOCUMENTS 6,548,972 B2 * 4/2003 Takagi ................. H05K 5/0213
361/688
8,184,438 B2 * 5/2012 Kaneko .................. H05K 7/026
361/728

(Continued)

FOREIGN PATENT DOCUMENTS

| CN | 202508058 U | | 10/2012 | |
|---|---|---|---|---|
| JP | 06270824 A | * | 9/1994 | ........... B62D 5/0406 |
| JP | 2015-120697 A | | 7/2015 | |

*Primary Examiner* — Kevin Hurley
*Assistant Examiner* — Maurice L Williams
(74) *Attorney, Agent, or Firm* — Maschoff Brennan (57) ABSTRACT

A power supply voltage terminal and a ground terminal having a rectangular cross section are respectively connected to a first terminal hole of a power supply pattern and a second terminal hole of a ground pattern. An inductor is surface-mounted on a substrate, and has a rectangular parallelepiped shape in which an input end connected to a power supply pattern and an output end connected to a power supply relay face each other. A first electrode terminal of a capacitor is connected to the power supply pattern, a second electrode terminal is connected to the ground pattern, and constitutes a filter circuit together with the inductor. A wall surface of an input end of the inductor is arranged parallel to the longitudinal axis direction (x direction) of the first terminal hole. The inductor opposes the first terminal hole so as to include the entire length Wh of the first terminal hole within the width Wt of the input end in the x direction.

7 Claims, 9 Drawing Sheets

(51) Int. Cl.
  *B62D 5/04*     (2006.01)
  *H02M 3/158*    (2006.01)
  *H02P 7/292*    (2016.01)

(52) U.S. Cl.
  CPC ............... *H02P 7/04* (2016.02); *H02P 7/292* (2013.01); *H05K 2201/1003* (2013.01); *H05K 2201/10015* (2013.01); *H05K 2201/10166* (2013.01); *H05K 2201/10295* (2013.01)

(56) References Cited

U.S. PATENT DOCUMENTS

| | | | |
|---|---|---|---|
| 8,467,193 B2* | 6/2013 | Oota | H05K 7/20854 |
| | | | 361/783 |
| 9,555,828 B2* | 1/2017 | Tashima | H05K 7/20854 |
| 11,084,521 B2* | 8/2021 | Tashima | H01L 23/36 |
| 2012/0098391 A1* | 4/2012 | Yamasaki | H02K 9/227 |
| | | | 310/68 D |
| 2012/0104886 A1* | 5/2012 | Yamasaki | B62D 5/0406 |
| | | | 310/71 |
| 2015/0189734 A1 | 7/2015 | Nishimoto et al. | |
| 2016/0174393 A1* | 6/2016 | Asao | B62D 5/0406 |
| | | | 180/443 |
| 2017/0253266 A1* | 9/2017 | Minamiguchi | B62D 6/008 |
| 2018/0022377 A1* | 1/2018 | Tsubaki | B62D 5/0466 |
| | | | 701/42 |
| 2018/0131256 A1* | 5/2018 | Fujimoto | B62D 5/0406 |
| 2018/0154926 A1* | 6/2018 | Ohira | B62D 15/02 |
| 2018/0201302 A1* | 7/2018 | Sonoda | H02K 11/215 |
| 2019/0016373 A1* | 1/2019 | Urimoto | B62D 5/04 |
| 2020/0255067 A1* | 8/2020 | Tanaka | H02P 29/028 |

\* cited by examiner

ELECTRIC POWER CONVERSION APPARATUS AND ELECTRIC POWER STEERING APPARATUS USING THE SAME

CROSS REFERENCE TO RELATED APPLICATION

The present application is a national stage application under 35 U.S.C. § 371(c) of PCT Application No. PCT/JP2017/012625, filed on Mar. 28, 2017, which is based on and incorporates herein by reference Japanese Patent Application No. 2016-109834 filed on Jun. 1, 2016.

TECHNICAL FIELD

The present disclosure relates to an electric power conversion apparatus that converts an electric power input from a DC power source and outputs the power to a load, and an electric power steering apparatus using the power conversion apparatus.

BACKGROUND

Conventionally, an electric power conversion apparatus converts electric power input from a DC electric power source such as a battery and outputs the power to a load such as a motor. For example, in an electric power conversion apparatus that drives a steering assist motor of an electric power steering apparatus, a power section to which a large current is supplied and a control section including a microcomputer and the like are arranged side by side on the same board due to a restriction of mounting space. Therefore, it is particularly important to appropriately radiate the heat generated by elements on a substrate.

For example, in the apparatus disclosed in Patent Document 1, the heat generated by a switching element mounted on the board is radiated to a connector side via a land pattern and is radiated to a heat sink via a heat radiation gel.

PRIOR ART LITERATURE

Patent Literature 1: JP 2015-126097 A

SUMMARY

Generally, a filter circuit including an inductor and a capacitor is provided at the input portion of the electric power conversion apparatus in order to remove a disturbance noise entering the apparatus from an electric power source harness and a switching noise going out from the apparatus to the outside. In addition, as an inductor of a filter circuit, in recent years, a surface mount inductor favoring miniaturization tend to be used in place of a conventional choke coil in which a winding is wound around a cylindrical core.

Although the device of Patent Literature 1 improves the heat dissipation properties of the switching element, the heat dissipation of the surface mount inductor is not considered. Therefore, the heat dissipation of the entire element mounted on the board is insufficient.

It is an object of the present disclosure to provide an electric power conversion apparatus that improves the heat dissipation of the surface mount type inductor.

The present disclosure is the electric power conversion apparatus that converts the electric power input from a DC power source via a power supply harness by operation of a electric power conversion circuit and outputs the electric power to a load. The electric power conversion apparatus includes a board, a connector portion, a power supply pattern, a ground pattern, a power supply relay, an inductor, and one or more capacitors.

The connector portion has a power supply voltage terminal and a ground terminal having a rectangular cross section, and the power supply harness can be inserted and attached to the connector portion.

The power supply pattern is formed on a surface layer of the substrate and has an elongated first terminal hole into which the power supply voltage terminal is inserted.

The ground pattern is formed on the surface layer of the substrate and has an elongated second terminal hole into which the ground terminal is inserted.

The power supply relay is provided at an input portion of the power conversion circuit and is capable of cutting off the power path.

The inductor is mounted on the surface of the board. The inductor has an input end connected to the power supply pattern and an output end connected to the power supply relay, and the input end and the output end have a rectangular parallelepiped shape facing each other. Here, "rectangular parallelepiped" is not limited to an exact rectangular parallelepiped, but means "substantially rectangular parallelepiped" whose whole is substantially block-shaped.

In one or more capacitors, one electrode terminal is connected to the power supply pattern and the other electrode terminal is connected to the ground pattern, and constitutes a filter circuit together with the inductor.

The inductor has a wall surface at the input end, which is arranged in parallel to the longitudinal axis direction of the first terminal hole. And at least part of the width of the input end and the entire length of the first terminal hole overlap in the longitudinal axis direction of the first terminal hole. Preferably, the inductor faces the first terminal hole so as to include the entire length of the first terminal hole within the width of the input end in the longitudinal axis direction of the first terminal hole. As far as possible from the standpoint of manufacturing, the distance from the first terminal hole to the input end of the inductor is preferably set as short as possible.

This makes it possible to appropriately radiate heat from the surface mount type inductor to the power supply harness via the power supply voltage terminal.

Further, the capacitor is surface-mounted on the substrate, the direction connecting the two electrode terminals is parallel to the connection direction connecting the input end and the output end of the inductor, and it is preferable that the electrode terminal connected to the ground pattern is arranged on the near side of the second terminal hole. By setting the distance between the capacitor and the ground terminal as short as possible and reducing the loop area of the filter circuit, noise resistance performance can be improved, since the distance between the capacitor and the ground terminal is set as short as possible, and the loop area of the filter circuit becomes small.

The power conversion apparatus of the present disclosure is applied, for example, as an apparatus for driving a steering assist motor in an electric power steering apparatus of a vehicle. Since the steering assist motor of the electric power steering apparatus is required to generate a large output suddenly, a large current flows in the inductor and the power conversion circuit and heat is generated. In addition, since the installation space of the power conversion apparatus in the vehicle is restricted, the power conversion apparatus must be made compact, so natural cooling becomes relatively disadvantageous. Therefore, according to the configuration of the present disclosure, the effect of improving the heat dissipation of the inductor is particularly effectively exhibited.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Hereinafter, a plurality of embodiments of the power conversion apparatus will be described with reference to the drawings. The power conversion apparatus of the present disclosure is applied, for example, as an apparatus for driving a steering assist motor in an electric power steering apparatus of a vehicle. The following first to fourth embodiments are collectively referred to as "present embodiment".

First, with reference to FIG. 1, a schematic configuration of an electric power steering apparatus will be described.

The electric power steering apparatus 90 includes a motor 80 as a "load" for outputting a steering assist torque, and an ECU 10 as a "power conversion apparatus" for supplying power to the motor 80.

The ECU 10 converts DC power of the battery 15 as "DC power supply" based on the torque signal trq from a torque sensor 95 provided on a steering shaft 92, and supplies the DC power to the motor 80. In accordance with the steering direction of the driver, for example, the motor 80 rotates normally when turning a steering wheel 91 to the right, and the motor 80 rotates reversely when turning the steering wheel 91 to the left.

Figure 1:
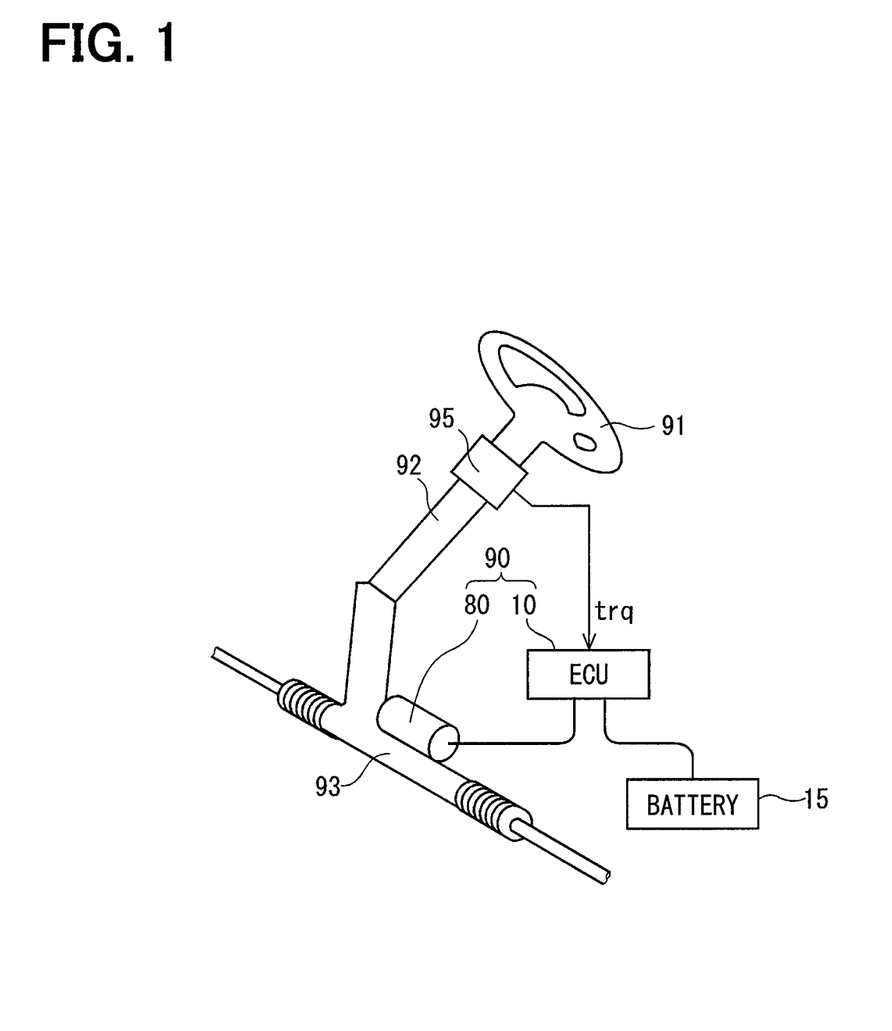
FIG. 1 is an overall schematic view of an electric power steering apparatus to which an ECU (power conversion apparatus) of each embodiment is applied.

Although the electric power steering apparatus 90 illustrated in FIG. 1 is a rack assist type in which the motor 80 is attached to a rack shaft 93, the present embodiment is similarly applicable to a column assist type electric power steering apparatus.

Next, referring to FIG. 2, the circuit configuration of the ECU 10 will be described by taking the case where the steering assist motor 80 is a DC motor as an example. The ECU 10 includes a power unit 60 including a power conversion circuit, and a control unit 70 that controls energization of the power unit 60.

In the case where the object to be driven is the DC motor 80, the power unit 60 includes a H bridge circuit in which four switching elements 61 to 64 are bridge-connected as a power conversion circuit. As the switching elements 61 to 64, for example, MOSFETs (that is, metal oxide semiconductor field effect transistors) are used.

A first node N1, which is an intermediate point of one half bridge of the H bridge circuit, and a second node N2 which is an intermediate point of the other half bridge, are connected to motor terminals 37 and 38, respectively. A motor relay 65 for preventing input of induced power from the motor 80 is provided on a power path LP connecting the first node N1 and the second node N2 via the motor 80. Further, for example, on a ground side of the H bridge circuit, a shunt resistor 67 for current detection is provided.

The control unit 70 acquires vehicle information such as a torque signal trq and a vehicle speed signal. In addition, the current information and the like detected by the power unit 60 are fed back, and a switching signal is outputted to the power conversion circuit of the power unit 60 based on these information. When the object to be driven is the DC motor 80, the control unit 70 controls the energization and a rotation direction of the motor 80.

A microcomputer 71, a custom IC 72, and the like are used as board mounted components constituting the control unit 70.

The drive power supplied to the power unit 60 and the control power for the operation of the control unit 70 are supplied from the common battery 15.

A power supply voltage terminal 33 of the ECU 10 is connected to a positive electrode of the battery 15 via the PIG line of the power supply harness 16. A ground terminal 34 is grounded via the PGND line of the power supply harness 16. Conduction of the IG line to which the control power is input is turned on or off by an ignition switch 17.

A power supply relay 45 capable of interrupting conduction of the PIG line is provided between the power supply voltage terminal 33 and the power unit 60. The power supply relay 45 is formed of two MOSFETs in which the directions of the parasitic diodes are connected in series in opposite directions, for example, in consideration of protection when the polarity of the battery 15 is erroneously reverse-connected. Alternatively, the power supply relay 45 may be constituted by an electromagnetic opening/closing type mechanical relay.

Hereinafter, "before" of the power supply relay 45 means the input side, that is, the power supply voltage terminal 33 side, and "after" of the power supply relay 45 means the power unit 60 side.

In the present embodiment, a filter circuit including an inductor 40 and a capacitor 50 is provided before the power supply relay 45. On the PIG line, an input end 43 of the inductor 40 is connected to the power supply voltage terminal 33, and an output end 44 is connected to a power supply relay 45. One electrode terminal 53 of the capacitor 50 is connected to the input end 43 of the inductor 40, and the other electrode terminal 54 thereof is connected to the ground terminal 34.

The filter circuit removes disturbance noise entering the ECU 10 from the external power supply harness 16 and eliminates switching noise that is generated along with the switching operation of the power unit 60 and exits to the outside from the ECU 10. "Noise-proof performance" described later means removal capability against both of these noises.

Behind the power supply relay 45, an after relay capacitor 55 for smoothing the input power to the power unit 60 is provided. When the terms are strictly used, the capacitor 50 connected to the input end 43 of the inductor 40 is a "before relay capacitor 50" corresponding to the "after relay capacitor 55". However, in the following description, we will not focus on the after relay capacitor 55, and refer to the before relay capacitor 50. For this reason, "the before relay capacitor 50" is omitted and simply referred to as "capacitor 50". Capacitor 50 before power supply relay 45 corresponds to "capacitor".

As described below, in the substrate mounting structure of the present embodiment, a surface mount type inductor is used as the inductor 40, not a choke coil type inductor.

Figure 2:
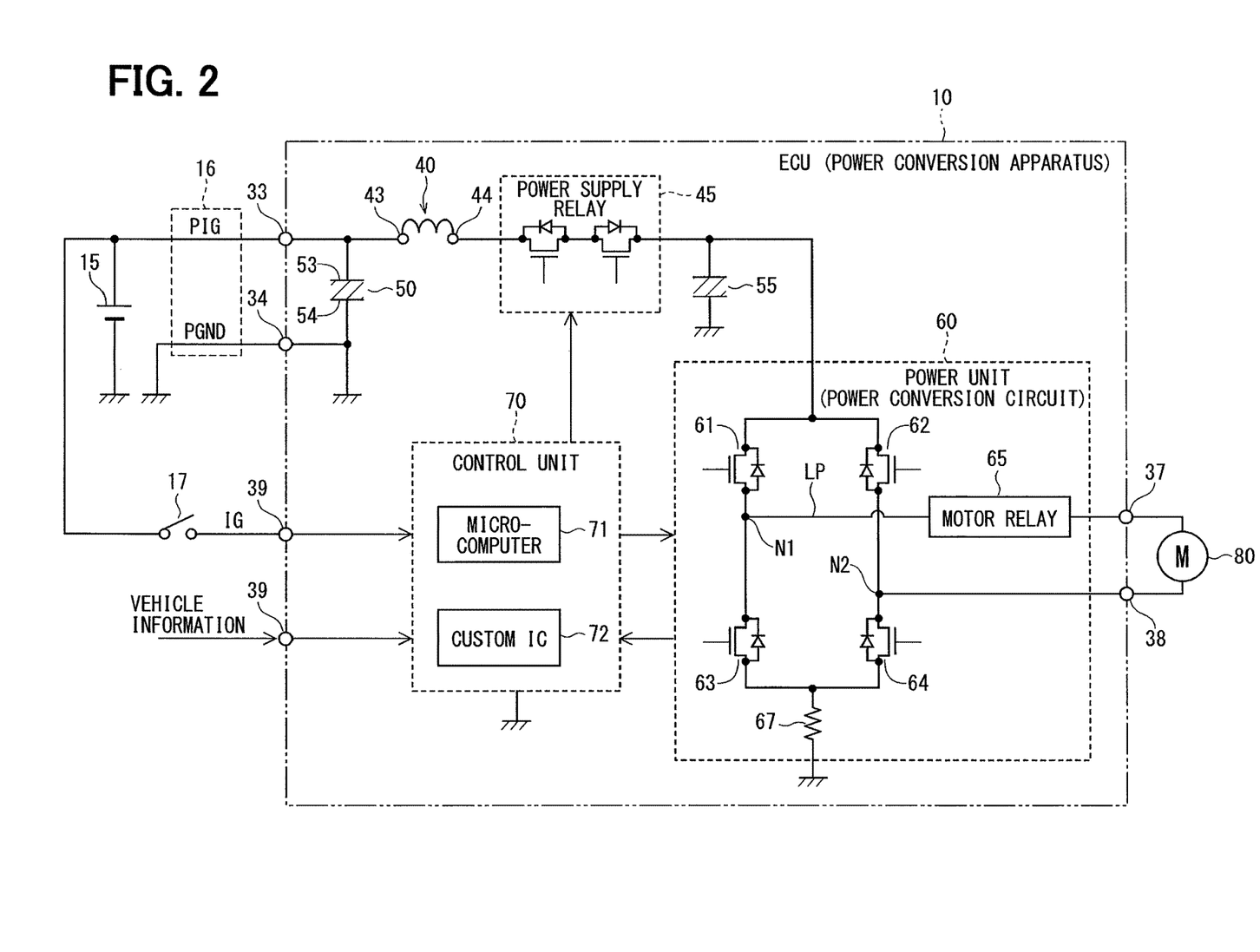
FIG. 2 is a circuit configuration diagram of an ECU according to each embodiment.

In addition, in FIG. 2, with regard to the capacitor 50 and the after relay capacitor 55 shown by one electric symbol, in actual substrate mounting, a plurality of capacitor elements may be connected in parallel. That is, the electrical symbol of one capacitor in FIG. 2 is interpreted as meaning "one or more capacitors" as an entity.

Meanwhile, the prior art disclosed in Patent Literature 1 (JP No. 2015-126097) does not consider radiation of the inductor.

Figure 3:
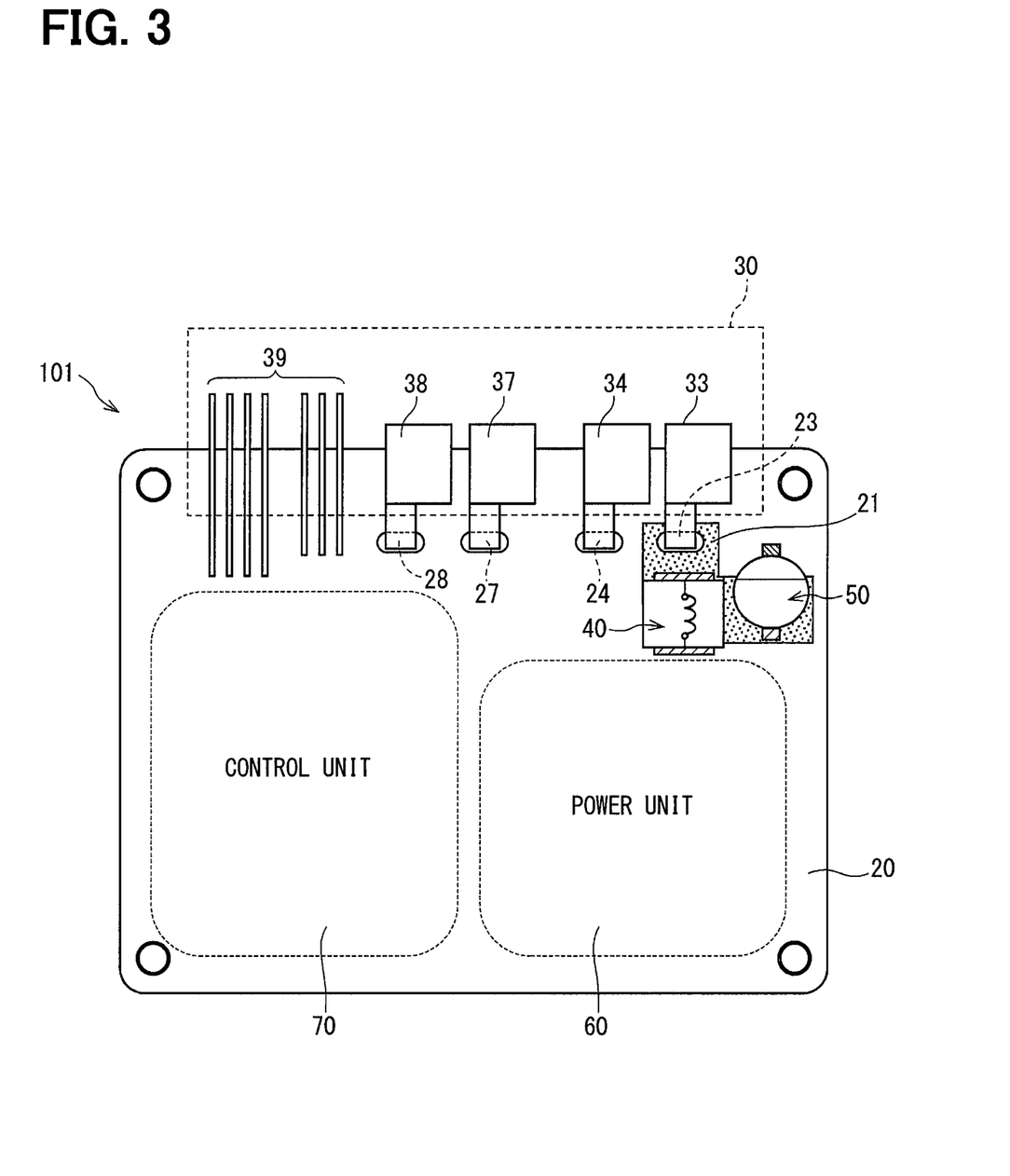
FIG. 3 is a plan view of the ECU board of a first embodiment.
Figure 4:
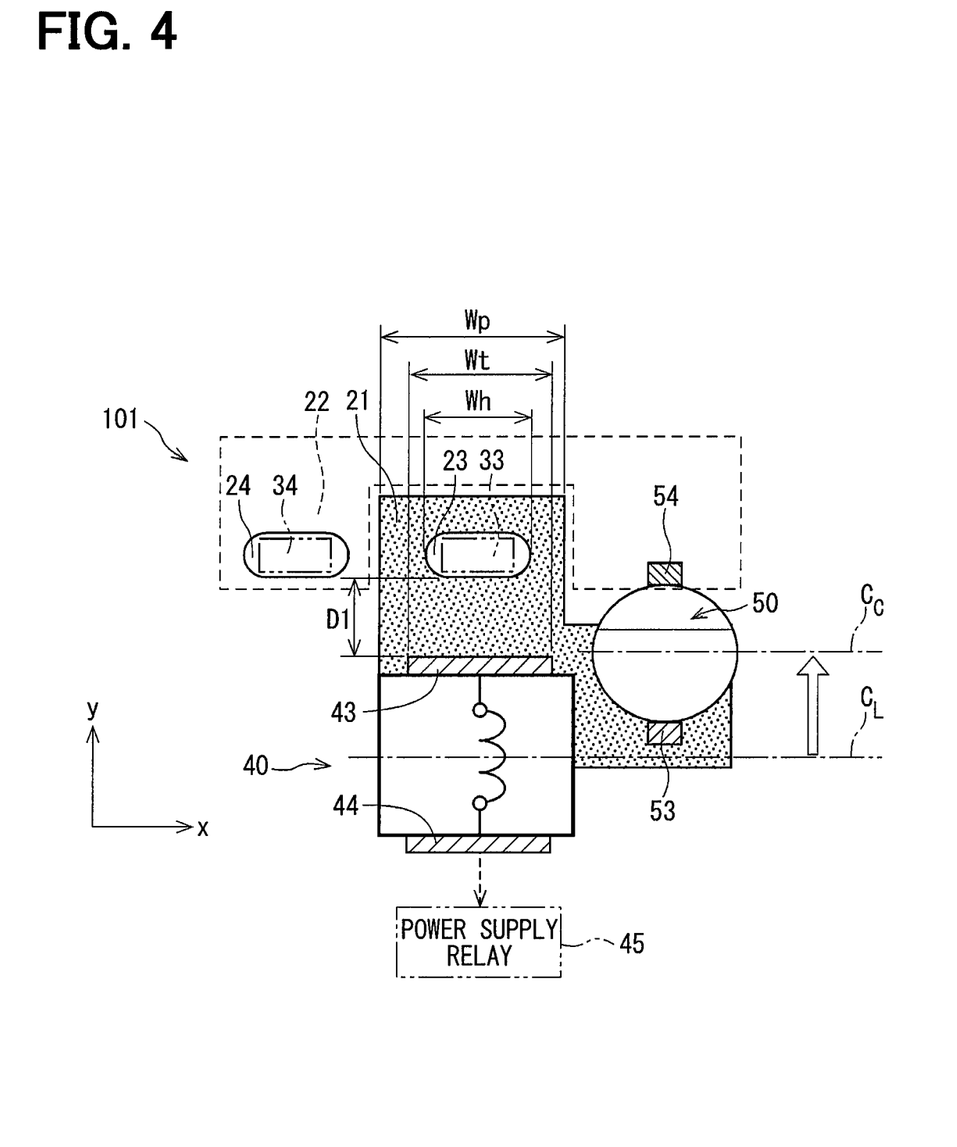
FIG. 4 is a schematic diagram showing a board mounting configuration of a filter circuit unit of an ECU in the first embodiment.

Although not explicitly described in the specification of Patent Literature 1, judging from the technical common sense of those skilled in the art from the description of FIG. 3, FIG. 4 and the like in Patent Literature 1, after the power supply relay, it is inferred that a surface mount type inductor and a plurality of after relay capacitors are provided. Also, according to conventional technical common knowledge, it is common to provide a power supply relay immediately after the power supply voltage terminal so as to avoid applying a voltage to the inductor or the capacitor when the relay is cut off.

In the present embodiment, in order to improve the heat dissipation of the inductor, the inductor 40 and the capacitor 50 are arranged before the power supply relay 45 as compared with such a conventional layout. In short, the configuration of this embodiment in which the surface mount type inductor 40 and the capacitor 50 are arranged before the power supply relay 45 clearly shows the contribution to the prior art.

In addition to this, in the present embodiment, in order to improve the heat dissipation of the inductor 40, specific arrangement of elements is devised regarding the element mounting configuration of the filter circuit section of the ECU 10. As described above, the substrate mounting structure of this embodiment aiming at improving the heat dissipation of the inductor 40, which is not noted at all in the prior art, does not correspond to so-called design matters.

Hereinafter, details of the board mounting configuration will be described for each embodiment. As the reference numeral of the ECU 10 of each embodiment, the number of the embodiment is added to the third digit following "10".

First Embodiment

Hereinafter, embodiments of the first embodiment will be described with reference to FIGS. 3 to 6. FIG. 3 is a plan view of the substrate 20 on which the circuit of the ECU 101 is mounted, and corresponds to FIG. 3 of Patent Literature 1 and the like. The following description of the mounting configuration is basically described with reference to the plan view which is the viewing direction of FIG. 3. The substrate 20 is made of an insulating material such as glass epoxy or ceramic and so on. On the surface layer of the substrate 20, a wiring pattern such as a power supply pattern 21 is formed of a conductive material such as copper or the like. In FIG. 3, illustration of wiring patterns other than the power supply pattern 21 is omitted.

In the present embodiment, illustration of the arrangement of the after relay capacitor 55, the arrangement of the switching elements 61 to 64 in the power unit 60, and the arrangement of the microcomputer 71 and the custom IC 72 in the control unit 70 are omitted in the figures.

In addition, illustration and description of a heat sink, a heat radiation gel, and the like which are described in detail in Patent literature 1 and mainly contribute to heat dissipation of the switching elements 61 to 64 are omitted.

On one side of the substantially rectangular substrate 20, there is provided a connector portion 30 into which a harness for inputting and outputting electric power and signals from or to the outside can be inserted. The connector portion 30 includes the power supply voltage terminal 33, the ground terminal 34, motor terminals 37 and 38, and a control terminal 39 corresponding to the circuit diagram of FIG. 2. The control terminal 39 is operated as a terminal to which the control power from the IG line is input and as a terminal to which the vehicle information signal is input. Further, how to group the plurality of harnesses corresponding to each terminal may be appropriately set. The harness including at least the PIG line is the power supply harness 16.

The power supply voltage terminal 33, the ground terminal 34, and the motor terminals 37, 38 are respectively inserted into the terminal holes 23, 24, 27, 28 formed in the substrate 20 and are electrically connected to the corresponding wiring patterns by soldering or the like. The motor terminals 37 and 38 in the connection configuration of these terminals are not mentioned any more.

The power supply voltage terminal 33 and the ground terminal 34 are formed in a rectangular cross section so as to be advantageous for energizing a large current. Correspondingly, the first terminal hole 23 into which the power supply voltage terminal 33 is inserted and a second terminal hole 24 into which the ground terminal 34 is inserted are formed in an elongated hole shape.

Subsequently, with reference to FIGS. 4, 6A, 6B, and 6C, the substrate mounting configuration of the filter circuit unit of the ECU 101 in the first embodiment will be described.

In FIG. 4, a region of the power supply pattern 21 formed on the surface layer of the substrate 20 is drawn in a satin finish.

In a ground pattern 22 formed on the surface layer of the substrate 20, a portion connecting the electrode terminal 54 of the capacitor 50 and the ground terminal 34 is indicated by a broken line frame.

As shown in FIG. 2, the ground pattern 22 is commonly connected to the ground side contact of the after relay capacitor 55, the power unit 60, and the control section 70. For example, in actual products, the entire surface layer region other than the regions of the power supply pattern 21 and other wiring pattern may be used as the ground pattern 22. However, in FIG. 4 and the like, the connection between the electrode terminal 54 of the capacitor 50 and the ground terminal 34 is specifically shown, so that the illustration of the ground pattern 22 in the other portions is omitted.

In the power supply pattern 21, an elongated first terminal hole 23 into which a power supply voltage terminal 33 having a rectangular cross section is inserted is formed. Similarly, in the ground pattern 22, an elongated second terminal hole 24 into which the ground terminal 34 having a rectangular cross section is inserted is formed.

In the example of FIG. 4, the first terminal hole 23 and the second terminal hole 24 are elongated holes and are configured so as to coincide by moving in parallel in one direction. However, the shape of the first terminal hole 23 and the second terminal hole 24 is not limited to this shape, but may be an "elongated" shape, for example, a rectangle with rounded corners or the like, so that the power supply voltage terminal 33 and the ground terminal 34 can be inserted without interference.

The power supply voltage terminal 33 and the ground terminal 34 respectively inserted into the first terminal hole 23 and the second terminal hole 24 are electrically connected to the power supply pattern 21 and the ground pattern 22, respectively, by soldering or the like.

Hereinafter, a longitudinal axis direction of the first terminal hole 23 is defined as "x direction". In the example of FIG. 4, the longitudinal axis of the first terminal hole 23 and the longitudinal axis of the second terminal hole 24 are arranged on the same straight line. In the other embodiment, the second terminal hole 24 may be parallel and offset, or nonparallel to the first terminal hole 23. Here, the total length in the x direction of the first terminal hole 23 is denoted by Wh.

The input end 43 of the inductor 40 and one electrode terminal 53 of the capacitor 50 are connected to the power supply pattern 21. The other electrode terminal 54 of the capacitor 50 is connected to the ground pattern 22.

In the present embodiment, a surface mount type inductor 40 is used as an inductor constituting a filter circuit.

Figure 6A:
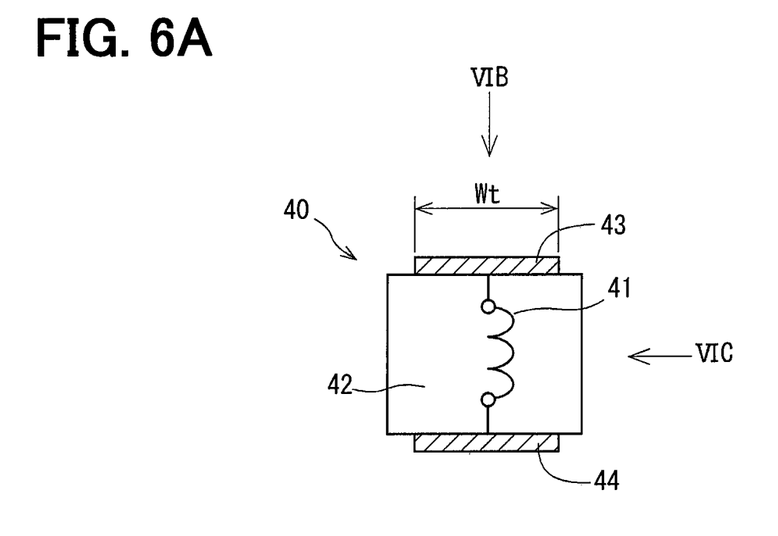
FIG. 6A is a plan view of a surface mount type inductor.
Figure 6B:
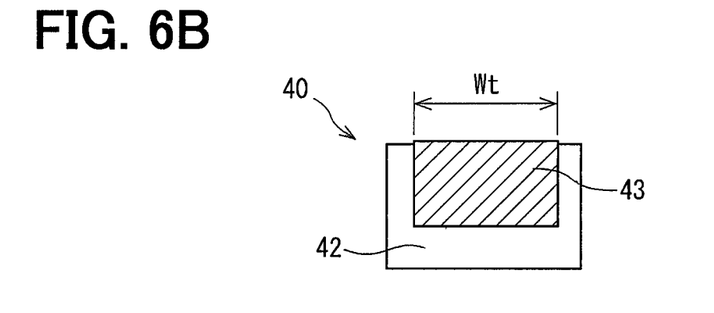
FIG. 6B is a view taken in the direction of arrow VIB of FIG. 6A.
Figure 6C:
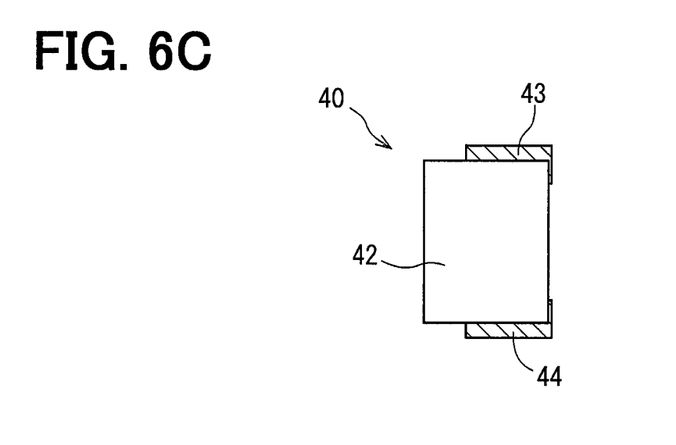
FIG. 6C is a view taken in the direction of arrow VIC of FIG. 6A.

FIGS. 6A, 6B, and 6C show three views of a surface mount type inductor 40 which has a substantially rectangular parallelepiped shape. A coil 41 described in the plan view of FIG. 6A is schematically shown as an electric symbol and does not represent the actual shape. The coil 41 is wound around the core of the main body 42.

The input end 43 and the output end 44 of the coil 41 are opposed to each other in the rectangular parallelepiped. Therefore, the wall surfaces of the input end 43 and the output end 44 are orthogonal to the connection direction of the coil 41 connecting the input end 43 and the output end 44 by the shortest distance.

There is no need to distinguish which side of the input end 43 and the output end 44 from the input end and the output end. For convenience of explanation, however, the end connected to the power supply pattern 21 is the input end 43, and the end connected to the wiring pattern on the side of the power supply relay 45 is the output end 44. The illustration of the wiring pattern on the power supply relay 45 side is omitted.

Also, the width of the input end 43 is denoted by Wt. In FIG. 4, the width Wp of the power supply pattern 21 in the portion connecting the first terminal hole 23 and the input end 43 is formed larger than the width Wt of the input end 43.

The capacitor 50 may be either an electrolytic capacitor having polarity or a nonpolar capacitor. Regardless of the presence or absence of polarity, the electrode terminal connected to the power supply pattern 21 serve as the first electrode terminal 53, and the electrode terminal connected to the ground pattern 22 correspond to the second electrode terminal 54.

The ECU 101 of the first embodiment has the following matters regarding the board mounting configuration of the filter circuit.

Figure 7:
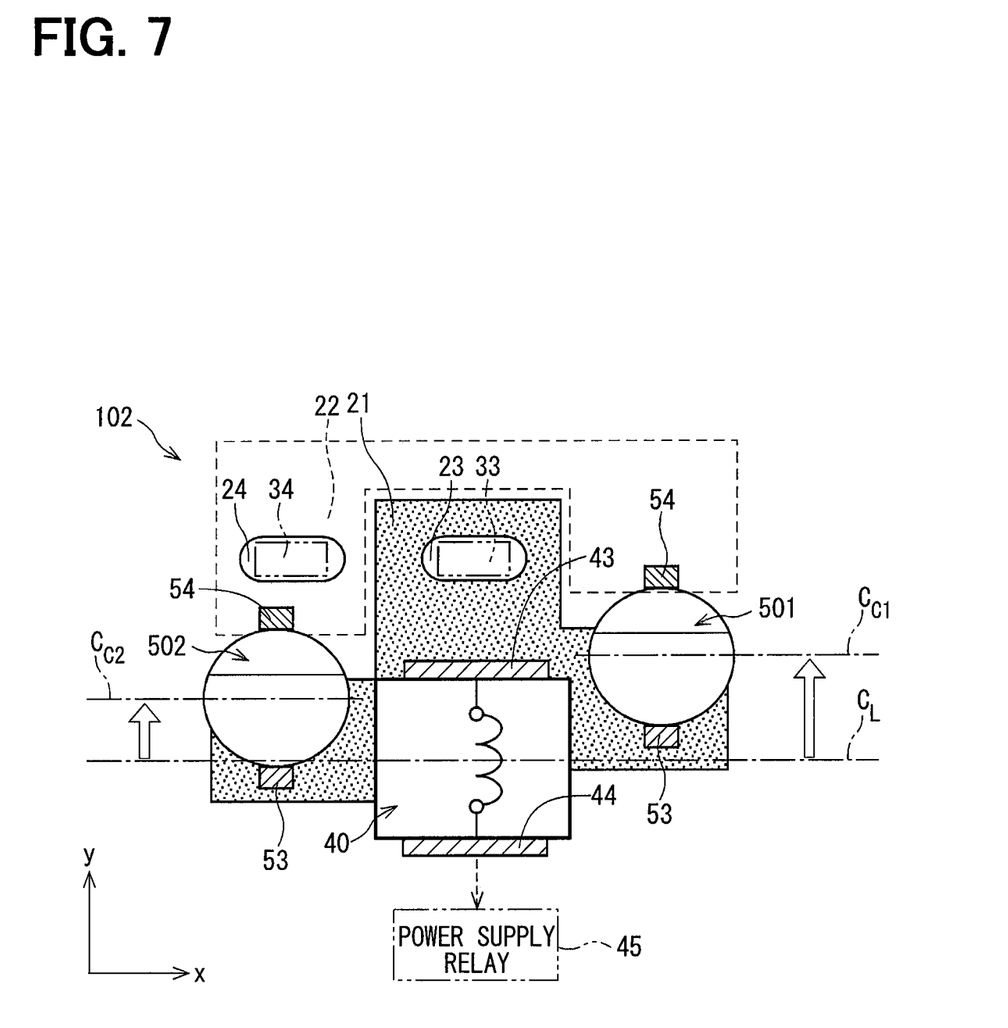
FIG. 7 is a schematic diagram showing a board mounted configuration of a filter circuit section of an ECU according to a second embodiment.
Figure 8:
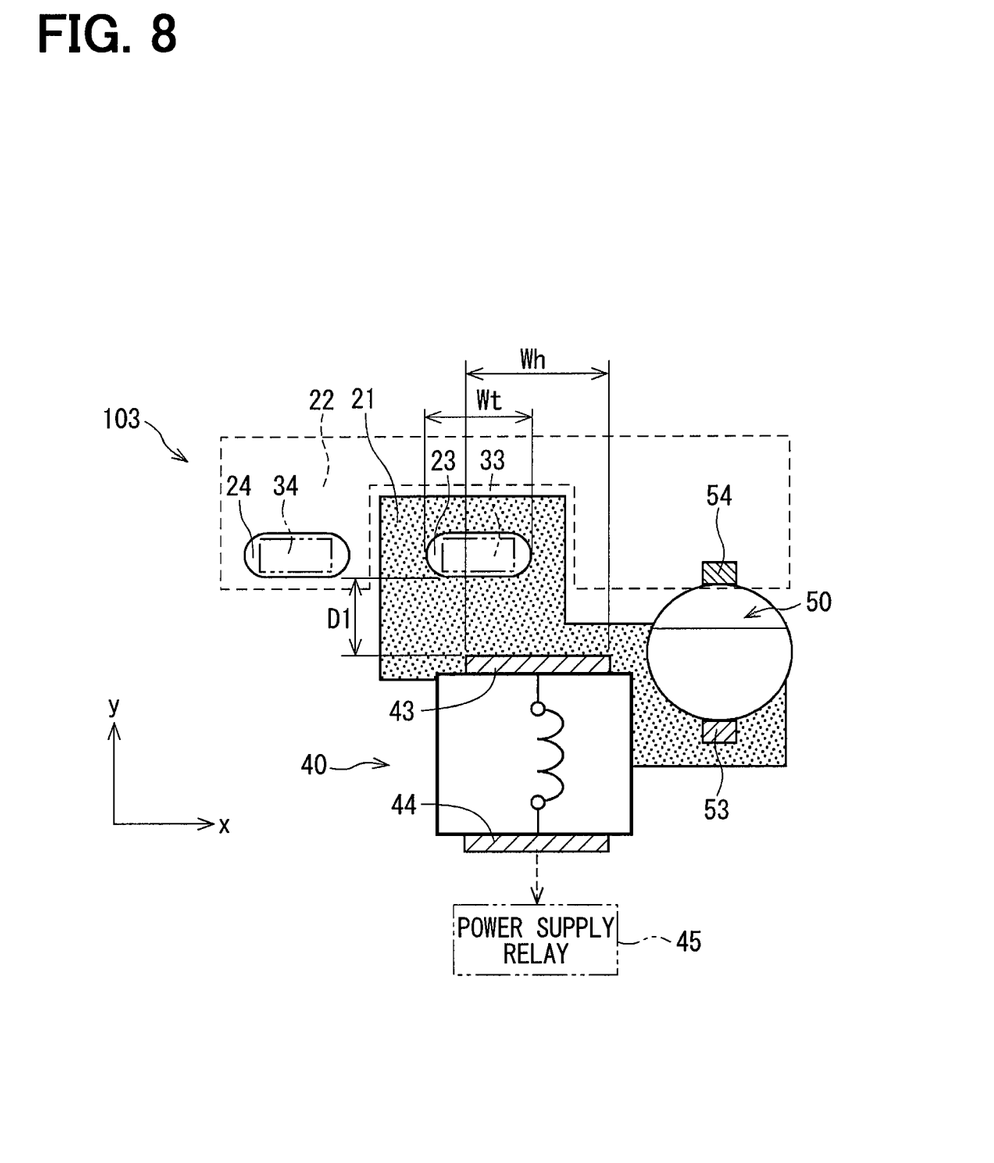
FIG. 8 is a schematic diagram showing a board mounting configuration of a filter circuit unit of an ECU according to a third embodiment.

(1) In the substantially rectangular parallelepiped surface mount type inductor 40, the wall surface of the input end 43 is disposed parallel to the x direction, which is the longitudinal axis direction of the first terminal hole 23. Therefore, the connection direction of the coil 41 orthogonal to the wall surface of the input end 43 is defined as the "y direction" orthogonal to the x direction. In the diagrams of FIGS. 4, 7 and 8, the xy coordinate axes are described as references.

In the x direction, at least a part of the width Wt of the input end 43 and the entire length Wh of the first terminal hole 23 overlap.

Figure 5:
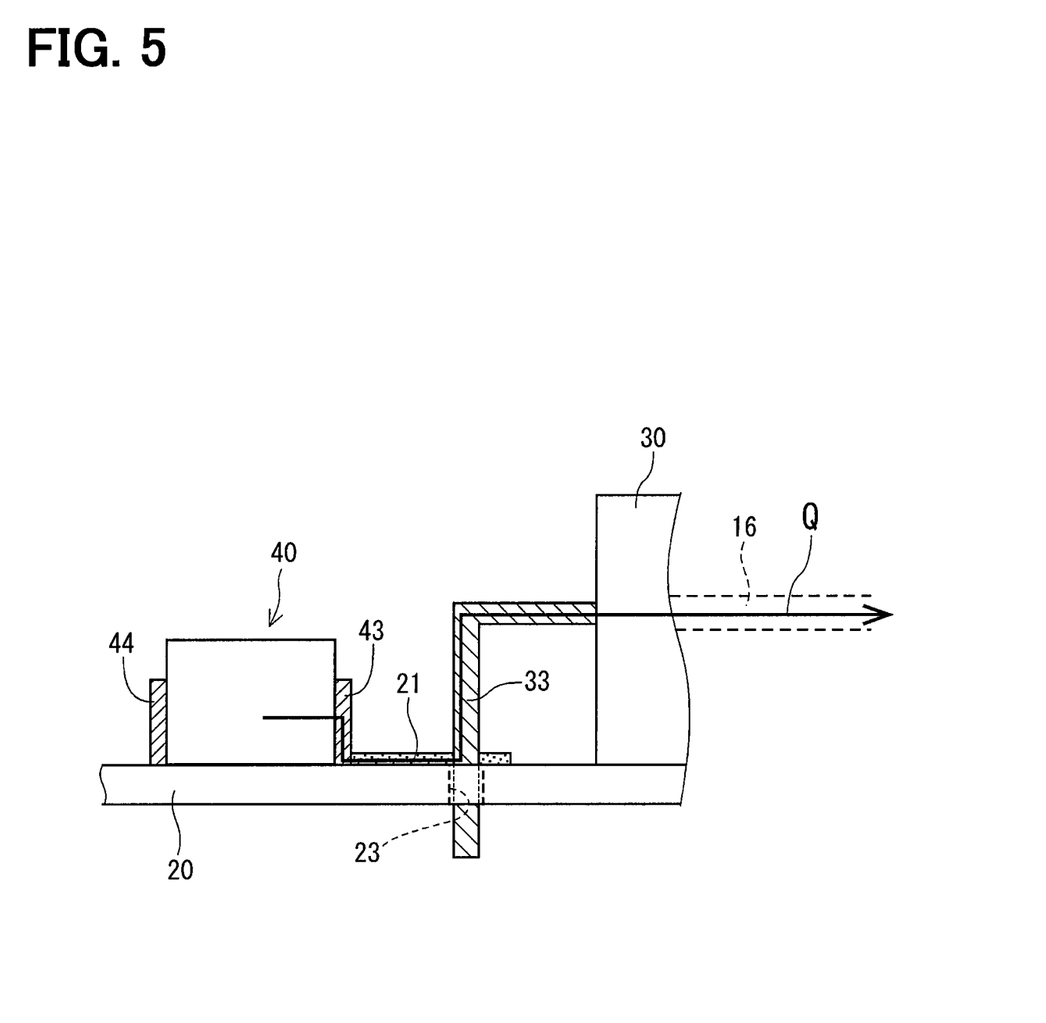
FIG. 5 is a side view showing a connection between a power supply voltage terminal and a surface mount type inductor.

As shown in FIG. 5, the heat Q of the inductor 40 is transmitted from the input end 43 to the power supply voltage terminal 33 inserted into the first terminal hole 23 via the power supply pattern 21 on the surface layer of the substrate 20, and further transmitted from the connector portion 30 to the power supply harness 16.

Therefore, in the heat transfer path of the power supply pattern 21 connecting the input end 43 and the first terminal hole 23, at least part of the input end 43 and the first terminal hole 23 are arranged so as to face each other. It is possible to effectively secure the heat path and to improve the heat radiation performance of the inductor 40.

Further, it is preferable that the distance D 1 between the input end 43 and the first terminal hole 23 be set as short as possible as far as possible in manufacturing.

Since the steering assist motor 80 of the electric power steering apparatus 90 is required to generate a large output suddenly, a large current flows in the inductor 40 in PIG line and the power unit 60 and heat is generated. In addition, since the installation space of the power conversion apparatus in the vehicle is restricted, ECU 101 must be made compact, so natural cooling becomes relatively disadvantageous. Therefore, with the above configuration, the effect of improving the heat dissipation of the inductor 40 is particularly effectively exhibited.

(2) In particular, in the first embodiment, the inductor 40 faces the first terminal hole 23 so as to include the entire length Wh of the first terminal hole 23 within the range of the width Wt of the input end 43 in the x direction. This makes it possible to particularly effectively secure the heat transfer path of the power supply pattern 21 on the surface layer of the substrate 20.

(3) In the capacitor 50, the direction connecting the first electrode terminal 53 and the second electrode terminal 54 is the y direction parallel to the connection direction of the inductor 40, and the second electrode terminal 54 is disposed on the side close to the second terminal hole 24. Here, "parallel to the wire connection direction" is not limited to strictly parallel but includes a range which can be interpreted as nearly parallel. In short, the configuration in which the direction connecting the first electrode terminal 53 and the second electrode terminal 54 does not coincide with the x direction, and which of the first electrode terminal 53 and the second electrode terminal 54 is closer to the second terminal hole 24, may be interpreted to be "parallel to the connection direction, that is, the y direction".

With this configuration, the distance between the second electrode terminal 54 and the ground terminal 34 can be shortened as much as possible and the loop area of the filter circuit can be reduced, so that noise resistance performance can be improved.

(4) As indicated by a block arrow in FIG. 4, in the y direction, the center position Cc of the capacitor 50 is offset toward the second terminal hole 24 side from the center position CL of the inductor 40. This is advantageous in shortening the distance between the second electrode terminal 54 and the ground terminal 34, and it is possible to further improve noise resistance.

Next, the configurations of the second, third, and fourth embodiments in which the board mounting configuration of the filter circuit portion is partially changed from the first embodiment will be described with reference to FIGS. 7, 8, and 9 corresponding to FIG. 4 of the first embodiment. In the following description of the embodiments, the same reference numerals are given to substantially the same configurations as those of the first embodiment, and a description thereof will be omitted.

Second Embodiment

Compared to the first embodiment, in the ECU 102 of the second embodiment shown in FIG. 7, two capacitors 501 and 502 are connected in parallel before the power supply relay 45. In the y direction, the center positions Cc 1 and Cc 2 of the two capacitors 501 and 502 are both located on the side of the second terminal hole 24 with respect to the center position CL of the inductor 40.

In addition, the second electrode terminals 54 of the capacitors 501 and 502 are disposed on the side closer to the second terminal hole 24 in the y direction.

The second embodiment has the same advantages as those of the first embodiment.

As a modification of the second embodiment, the filter circuit of the input section may be constituted by three or more behind relay capacitors connected in parallel between the power supply pattern 21 and the ground pattern 22. In a configuration in which a plurality of behind relay capacitors are connected in parallel, it is preferable that the center position of at least one of the capacitors is located on the side of the second terminal hole 24 with respect to the center position CL of the inductor 40.

Third Embodiment

Compared to the first embodiment, in the ECU 103 of the third embodiment shown in FIG. 8, the positional relationship between the inductor 40 and the first terminal hole 23 is different. In the x direction, the range Wt of the input end 43 of the inductor 40 does not completely include the range Wh of the first terminal hole 23, and partly overlaps. It is preferable that the distance D 1 between the input end 43 and the first terminal hole 23 be set as short as possible as in the first embodiment.

The third embodiment has the same effects as the effects (1), (3), and (4) of the first embodiment.

Fourth Embodiment

Figure 9:
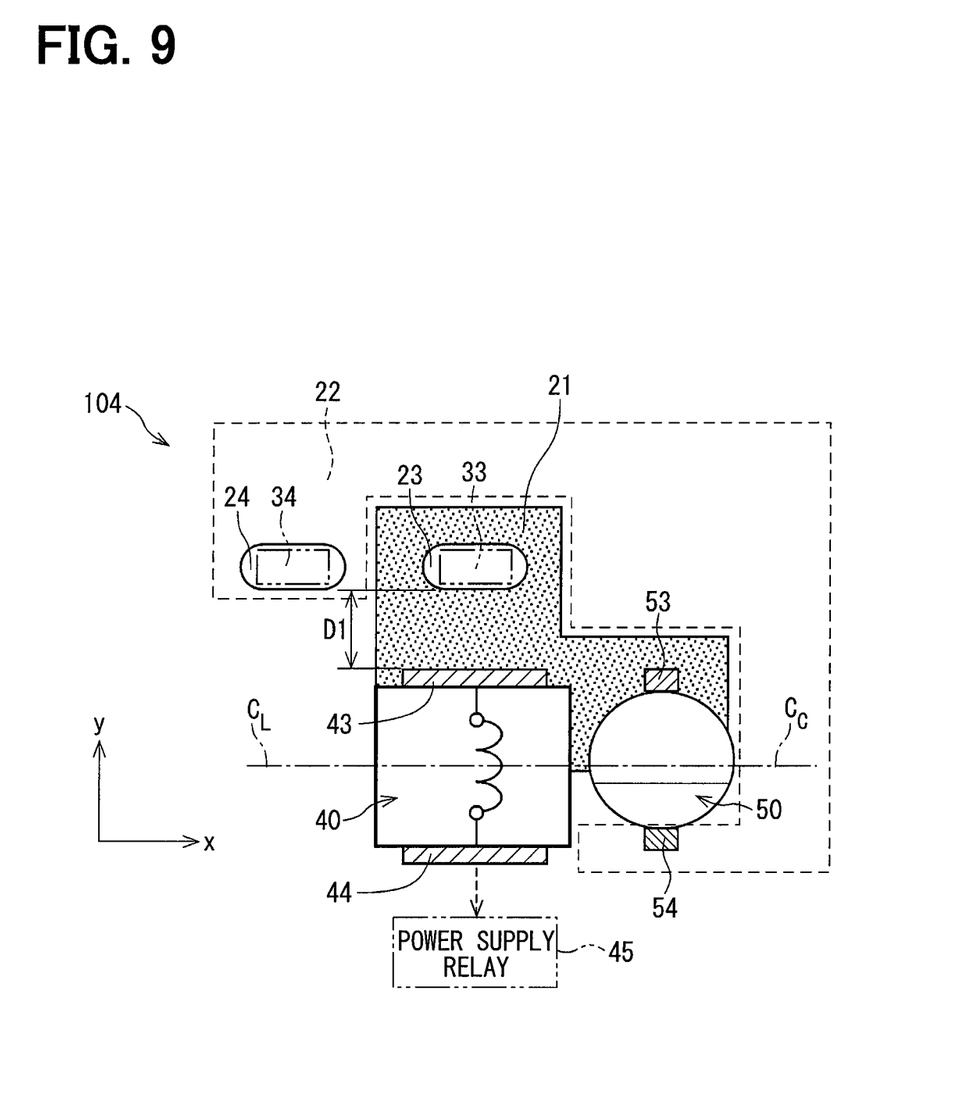
FIG. 9 is a schematic diagram showing a board mounting configuration of a filter circuit unit of an ECU according to a fourth embodiment.

Compared to the first embodiment, the ECU 104 of the fourth embodiment shown in FIG. 9 has a different positional relationship between the inductor 40 and the capacitor 50. In the y direction, the center position Cc of the capacitor 50 is substantially at the same position as the center position CL of the inductor 40. In brief expression, in FIG. 9, the capacitor 50 is arranged just beside the inductor 40.

Further, the second electrode terminal 54 of the capacitor 50 is arranged on the side farther from the second terminal hole 24 in the y direction. Therefore, a part of the ground pattern 22 extends so as to go around the capacitor 50 side of the power supply pattern 21.

The fourth embodiment has the same effects as the effects (1), and (2) of the first embodiment.

Other Embodiments (a) With respect to the mounting configuration of the substrate 20 in the embodiment of the present disclosure, the arrangement other than the arrangement of the inductor 40 and the capacitor 50 and the terminal holes 23 and 24 of the power supply pattern 21 and the ground pattern 22, is not limited to the configuration shown in FIG. 3. For example, the arrangement of the area of the power unit 60 and the area of the control unit 70 may be changed in FIG. 3. Alternatively, instead of mounting the power unit 60 and the control unit 70 on the same board, the power board and the control board may be separately provided.

(b) In the present disclosure, the shape of the heat sink accommodating the substrate 20 and the point of filling the heat radiation gel or the like between the switching elements 61 to 64 of the power unit 60 and the heat sink are not specified. However, by combining with the present disclosure by utilizing the conventional technique of Patent Literature 1, it can be expected that the heat radiation performance of the entire ECU board including the switching elements 61 to 64 and the inductor 40 is improved.

(c) In the above embodiment in which the DC motor is driven, a three-phase inverter may be provided as a power conversion circuit of the power section, and a power conversion apparatus that drives a three-phase AC motor as a load may be used.

Further, the power conversion apparatus of the present disclosure is not limited to the apparatus that drives the steering assist motor of the electric power steering apparatus, but can be applied to any power conversion apparatus that converts the power input from the DC power supply and outputs it to some load.

The present disclosure is not limited to the embodiments described above, and various modifications are possible within the scope of the present disclosure without departing from the spirit of the invention.

The present disclosure has been described in accordance with embodiments. However, the present disclosure is not limited to this embodiment and structure. This disclosure also encompasses various modifications and variations within the scope of equivalents.

Furthermore, various combination and formation, and other combination and formation including one, more than one or less than one element may be made in the present disclosure.

The invention claimed is:

1. A power conversion apparatus that converts electric power input from a direct current power supply via a power supply harness by a power conversion circuit and outputs the electric power to a load;
   a substrate;
   a connector portion having a power supply voltage terminal and a ground terminal whose cross sections are rectangular in shape and being configured to be capable of inserting and attaching the power supply harness;
   a power supply pattern formed on a surface layer of the substrate and having an elongated first terminal hole into which the power supply voltage terminal is inserted;
   a ground pattern formed on a surface layer of the substrate and having an elongated second terminal hole into which the ground terminal is inserted;
   a power supply relay provided at an input portion of the power conversion circuit and configured to be capable of cutting off a power path;

an inductor being surface-mounted on the substrate, and having a rectangular parallelepiped shape in which an input end connected to the power supply pattern and an output end connected to the power supply relay face each other; and one or more capacitors constituting a filter circuit together with the inductor, and having one electrode terminal being connected to the power supply pattern, and the other electrode terminal being connected to the ground pattern, wherein a wall surface of the input end of the inductor is disposed in parallel to a longitudinal axis direction of the first terminal hole and a width of the input end and a total length of the first terminal hole at least partially overlap each other in the longitudinal axial direction of the first terminal hole.

2. The power conversion apparatus according to claim 1, wherein
the inductor is opposed to the first terminal hole so as to include the entire length of the first terminal hole within a range of a width of the input end in the longitudinal axis direction of the first terminal hole.

3. The power conversion apparatus according to claim 2, wherein
the capacitor is surface mounted on the substrate, a direction connecting two electrode terminals is parallel to a connection direction connecting the input end and the output end of the inductor, and an electrode terminal connected to the ground pattern is disposed on a side close to the second terminal hole.

4. The power conversion apparatus according to claim 1, wherein
the capacitor is surface mounted on the substrate, a direction connecting two electrode terminals is parallel to a connection direction connecting the input end and the output end of the inductor, and an electrode terminal connected to the ground pattern is disposed on a side close to the second terminal hole.

5. The power conversion apparatus according to claim 4, wherein
in the connection direction of the inductor a center position of at least one of the capacitors is located on the second terminal hole side with respect to a center position of the inductor.

6. An electric power steering apparatus, comprising:
a power conversion apparatus according to claim 1 mounted on a vehicle; and
a motor configured to output a steering assist torque by electric power supplied from the power conversion device, and being as the load.

7. The power conversion apparatus according to claim 1, wherein
a width of the power supply pattern in the portion connecting the first terminal hole and the input end is formed larger than the width of the input end.

* * * * *